United States Patent
Chan et al.

(10) Patent No.: US 10,778,269 B1
(45) Date of Patent: Sep. 15, 2020

(54) SIGNAL RECEIVING CIRCUIT AND WIRELESS COMMUNICATION SYSTEM

(71) Applicant: Realtek Semiconductor Corporation, Hsinchu (TW)

(72) Inventors: Ka-Un Chan, Zhubei (TW); Han-Ting Tsai, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/592,917

(22) Filed: Oct. 4, 2019

(30) Foreign Application Priority Data

Feb. 27, 2019 (TW) .............................. 108106888 A

(51) Int. Cl.
| | |
|---|---|
| H04L 27/08 | (2006.01) |
| H04B 1/12 | (2006.01) |
| H03G 3/00 | (2006.01) |
| H04B 1/00 | (2006.01) |

(52) U.S. Cl.
CPC ............. H04B 1/123 (2013.01); H03G 3/007 (2013.01); H04B 1/006 (2013.01)

(58) Field of Classification Search
CPC .......... H04B 1/123; H04B 1/006; H04B 1/18; H04B 1/28; H03G 3/007; H03G 1/0088; H03D 7/1441

USPC .......................... 375/316, 318, 324, 346, 345
See application file for complete search history.

(56) References Cited

U.S. PATENT DOCUMENTS

| | | | |
|---|---|---|---|
| 8,971,831 B2 | 3/2015 | Vidojkovic et al. | |
| 2003/0081694 A1* | 5/2003 | Wieck .................. | H03G 1/0088 375/316 |
| 2005/0043004 A1* | 2/2005 | Kaizaki ................ | H03D 7/1441 455/326 |
| 2007/0052406 A1* | 3/2007 | Payne, IV ............ | H04B 1/28 324/76.23 |
| 2011/0117868 A1 | 5/2011 | Vahidfar et al. | |
| 2013/0214863 A1* | 8/2013 | Vidojkovic ........... | H04B 1/18 330/260 |

\* cited by examiner

Primary Examiner — Phuong Phu
(74) Attorney, Agent, or Firm — Locke Lord LLP; Tim Tingkang Xia, Esq.

(57) ABSTRACT

A signal receiving circuit includes a first amplifier, a switch circuit, a second amplifier and a mixer. The first amplifier is configured to amplify a radio frequency (RF) signal to generate a first amplified RF signal. The switch circuit is configured to receive the first amplified RF signal. The second amplifier is configured to receive and amplify the first amplified RF signal to generate a second amplified RF signal. The mixer is configured to modulate one of the first amplified RF signal and the second amplified RF signal to generate a mixed signal, wherein the switch circuit is configured to determine whether the first amplified RF signal is amplified by the second amplifier.

8 Claims, 2 Drawing Sheets

SIGNAL RECEIVING CIRCUIT AND WIRELESS COMMUNICATION SYSTEM

RELATED APPLICATIONS

This application claims priority to Taiwan Application Serial Number 108106888, filed Feb. 27, 2019, which is herein incorporated by reference in its entirety.

BACKGROUND

Technical Field

The present disclosure relates to a signal receiving circuit. More particularly, the present disclosure relates to a signal receiving circuit and wireless communication system for switching different low noise amplifier.

Description of Related Art

As system integration and interference in the environment increases, the receiver of the wireless communication system needs to enhance the anti-jamming function in addition to better sensitivity. Especially when the frequency band of the interference signal overlaps the frequency band of the received signal, the linearity of the low noise amplifier (LNA) needs to be improved without affecting the sensitivity of the reception. However, when decreasing the gain of the low noise amplifier, the linearity of the receiving system is increased, but the noise figure is also increased to affect the sensitivity of the receiving system. Therefore, regardless of whether the signal is interfered, a receiving system for maintaining the sensitivity is required.

SUMMARY

Some aspects of the present disclosure are related to a signal receiving circuit that includes a first amplifier, a switch circuit, second amplifier and a mixer. The first amplifier is electrically coupled to a node and configured to amplify a radio frequency signal to generate a first amplified radio frequency signal. The switch circuit is electrically coupled to the node and configured to receive the first amplified radio frequency signal. The second amplifier is electrically coupled to the switch circuit and configured to receive and amplify the first amplified radio frequency signal to generate a second amplified radio frequency signal. The mixer is electrically coupled to the second amplifier and configured to modulate one of the first amplified radio frequency signal and the second amplified radio frequency signal to generate a mixed signal, wherein the switch circuit is configured to determine whether the first amplified radio frequency signal is amplified by the second amplifier.

Some aspects of the present disclosure are related to a wireless communication system that includes an antenna and a signal receiving circuit. The antenna is disposed outside a chip and electrically coupled to a pad. The signal receiving circuit is disposed inside the chip and electrically coupled to the pad, and the signal receiving circuit includes a first amplifier, a switch circuit, second amplifier and a mixer. The first amplifier is electrically coupled to a node and configured to amplify a radio frequency signal to generate a first amplified radio frequency signal. The switch circuit is electrically coupled to the node and configured to receive the first amplified radio frequency signal. The second amplifier is electrically coupled to the switch circuit and configured to receive and amplify the first amplified radio frequency signal to generate a second amplified radio frequency signal. The mixer is electrically coupled to the second amplifier and configured to modulate one of the first amplified radio frequency signal and the second amplified radio frequency signal to generate a mixed signal, wherein the switch circuit is configured to determine whether the first amplified radio frequency signal is amplified by the second amplifier.

As described above, the signal receiving circuit and the wireless communication system provided in embodiments of the present disclosure utilize the switch circuit to determine whether the radio frequency signal is amplified, so that the receiving system can have better flexibility when receiving different signals. As a result, the gain of the receiving system can be adjusted to prevent the gain of the signal into non-linear area when it is amplified.

DETAILED DESCRIPTION

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in figures are designated with the same reference numbers.

Figure 1:
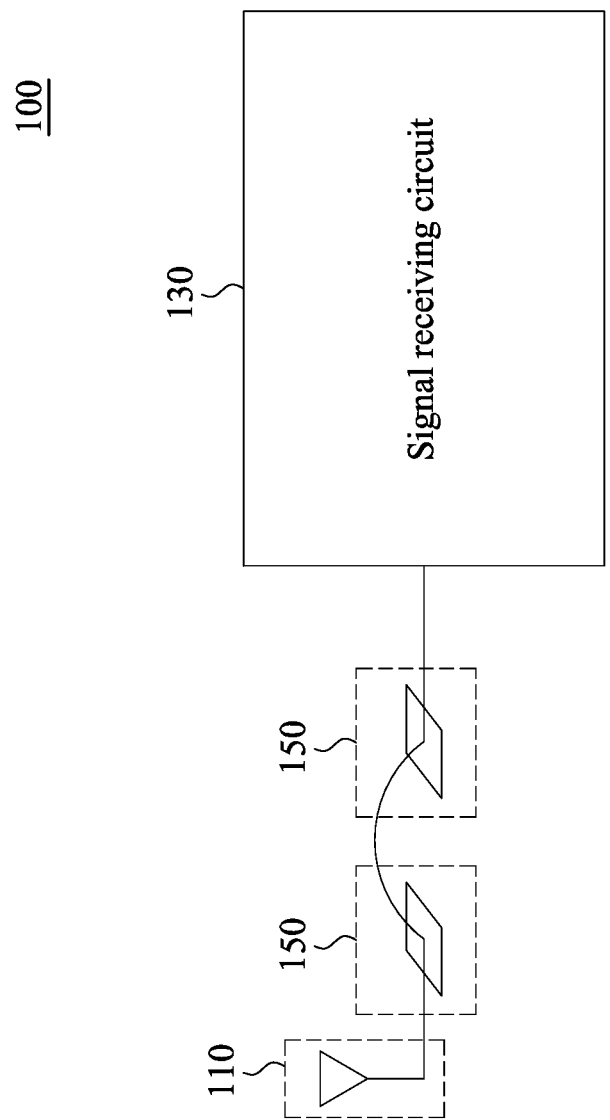
FIG. 1 is a functional block diagram illustrating a wireless communication system according to one embodiment of the present disclosure.

Reference is made to FIG. 1, which is a functional block diagram illustrating a wireless communication system 100 according to one embodiment of the present disclosure. The wireless communication system 100 includes an antenna 110 and a signal receiving circuit 130. The antenna 110 is disposed outside a chip and electrically coupled to a pad 150. The signal receiving circuit 130 is disposed inside the chip and electrically coupled to the pad 150. In the embodiment, the antenna 110 operates in a first frequency band and a second frequency band, wherein the first frequency band includes the WiFi band and thus the first frequency band is the 2.412~2.484 GHz frequency band. The second frequency band includes the Bluetooth band and thus the second frequency band is the 2.402~2.480 GHz frequency band.

Figure 2:
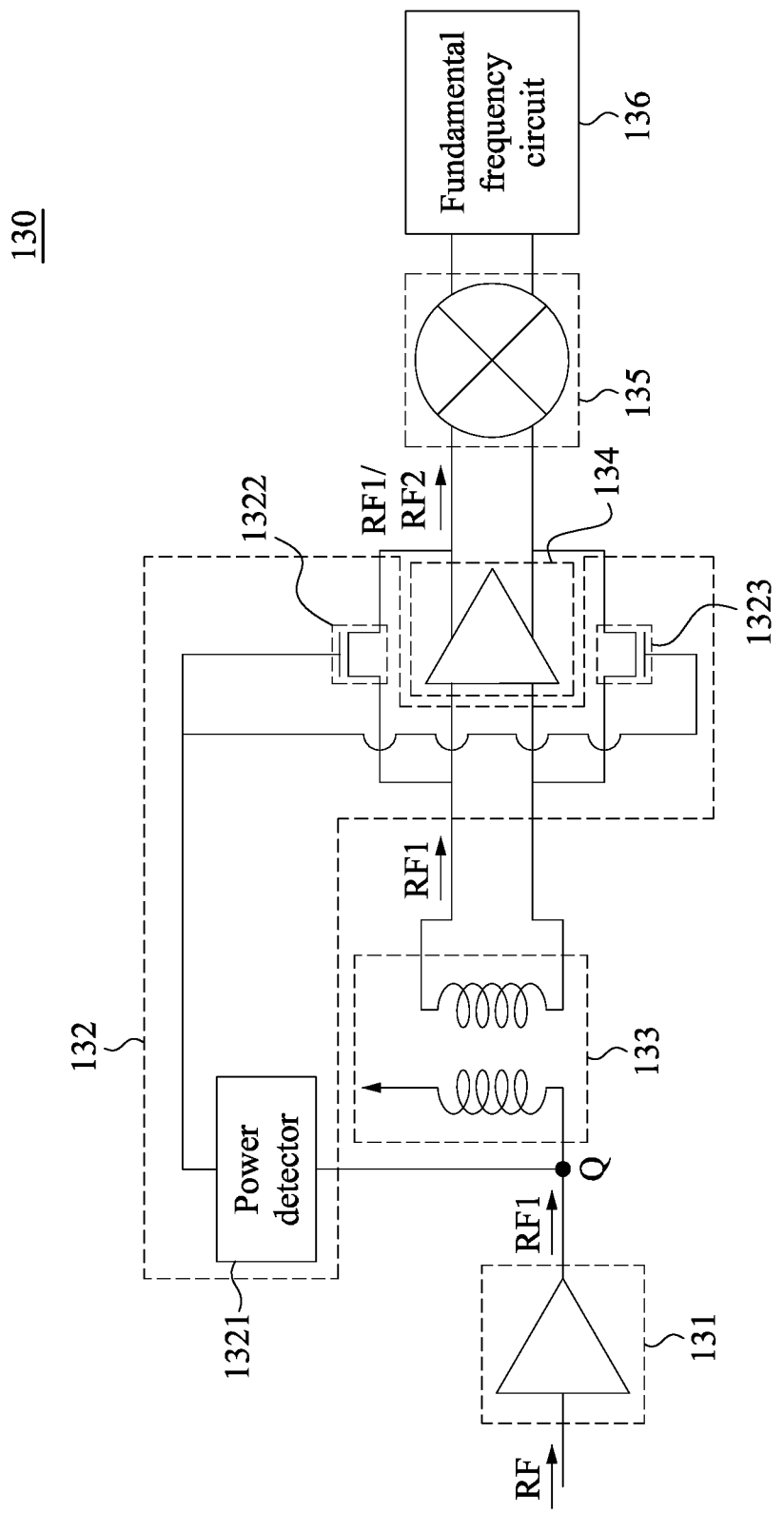
FIG. 2 is a schematic diagram illustrating the signal receiving circuit according to one embodiment of the present disclosure.

Reference is made to FIG. 2, which is a schematic diagram illustrating the signal receiving circuit 130 according to one embodiment of the present disclosure. The signal receiving circuit 130 includes a first amplifier 131, a switch circuit 132, a transformer 133, a second amplifier 134, a mixer 135 and a fundamental frequency circuit 136. The first amplifier 131 is electrically coupled to a node Q and the transformer 133. The switch circuit 132 is electrically coupled to the node Q, the transformer 133 and the second amplifier 134. The second amplifier 134 is electrically coupled to the switch circuit 132, the transformer 133 and the mixer 135. The mixer 135 is electrically coupled to the switch circuit 132, the second amplifier 134 and the fundamental frequency circuit 136.

Reference is made to FIG. 1 and FIG. 2. The first amplifier 131 is configured to receive the radio frequency signal RF via the antenna 110, the radio frequency signal RF includes the noise signal and the data signal. The first amplifier 131 is configured to amplify the radio frequency signal RF according the gain and generate the first amplified radio frequency signal RF1. The transformer 133 is configured to transmit the first amplified radio frequency signal RF1 to the second amplifier 134 as an input signal of the second amplifier 134. The switch circuit 132 is configured to receive the first amplified radio frequency signal RF1 and determine whether the first amplified radio frequency signal RF1 is amplified by the second amplifier 134 to generate a second amplified radio frequency signal RF2. The mixer 135 is configured to modulate one of the first amplified radio frequency signal RF1 and the second amplified radio frequency signal RF2 to generate a mixed signal. The mixed signal can be implemented by the intermediate frequency signal or fundamental frequency signal. After the noise signal is filtered by the fundamental frequency circuit 136, the fundamental frequency circuit 136 is configured to perform the demodulation, decoding and demultiplexing.

Afterwards, the switch circuit 132 includes a power detector 1321, two switches 1322 and 1323. The power detector 1321 is electrically connected to the node Q. The first node of the switch 1322 is electrically coupled to one of the input node of the second amplifier 134. The second node of the switch 1322 is electrically coupled to one of the output node of the second amplifier 134. The control node of the switch 1322 is electrically coupled to the power detector 1321. The first node of the switch 1323 is electrically coupled to another of the input node of the second amplifier 134. The second node of the switch 1323 is electrically coupled to another of the output node of the second amplifier 134. The control node of the switch 1323 is electrically coupled to the power detector 1321.

Afterwards, the power detector 1321 is configured to detect the voltage of the node Q and determine whether the voltage of the node Q is higher than a threshold. In the embodiment, the threshold can be adjusted according to the gain, and the threshold is assumed as −10 dBm. However, the disclosure is not limited thereto. If the voltage of the node Q is higher than the threshold, the power detector 1321 is configured to output a control signal to switch the switch 1322 and 1323 to an enable mode, and the switch circuit 132 is configured to output the first amplified radio frequency signal RF1 to the mixer 135. If the voltage of the node Q is lower than the threshold, the power detector 1321 is configured to output the control signal to switch the switch 1322 and 1323 to a disable mode, and the second amplifier 134 is configured to receive and amplify the first amplified radio frequency signal RF1 and output the second amplified radio frequency signal RF2 to the mixer 135.

Afterwards, the power detector 1321 is configured to determine whether the strength of the first amplified radio frequency signal RF1 is higher than a threshold. If the strength of the first amplified radio frequency signal RF1 is higher than the threshold, it is represented that the first amplified radio frequency signal RF1 is not amplified by the second amplifier 134 because the gain of the first amplifier 131 is enough. In contrast, if the strength of the first amplified radio frequency signal RF1 is not higher than the threshold, it is represented that the gain of the first amplifier 131 is not enough. In this situation, if the first amplified radio frequency signal RF1 is inputted directly to the mixer 135, it will cause that the first amplified radio frequency signal RF1 could not be distinguished between the target signal and the noise signal after the mixing process stage. Therefore, the second amplifier 134 is configured to amplify the first amplified radio frequency signal RF1 to generate the second amplified radio frequency signal RF2.

Afterwards, for example, it is assumed that the target signal is the WiFi signal and the noise signal is the Bluetooth signal. The extent of overlap between the frequency bands of the WiFi signal and the Bluetooth signal is high. However, after the frequency downconversion, the frequency band of the WiFi signal is the 20 MHz or 40 MHz and the Bluetooth signal is about 1 MHz. Therefore, if the signal is amplified enough in the amplifier stage and the linearity of the amplified signal will not become worse, the amplified signal can be distinguished between the target signal and the noise signal in the downconverter stage. In the embodiment, it is assumed that the gain of the first amplifier 131 is 20 dB. If the strength of the first amplified radio frequency signal RF1 determined by the power detector 1321 is not higher than the threshold, the second amplifier 134 is configured to amplify the first amplified radio frequency signal RF1. It is assumed that the gain value of the second amplifier 134 is 10 dB, and thus the total gain of the first amplifier 131 and the second amplifier 134 is 30 dB. The gain of the amplifier is given with the example, but the present disclosure is not limited thereto. In the operation, if the WiFi signal is much smaller than the Bluetooth signal, the reception of the receiving system will not be affected even though the linearity of the Bluetooth signal becomes worse.

As described above, the signal receiving circuit and the wireless communication system provided in embodiments of the present disclosure utilize the switch circuit to determine whether the strength of the amplified radio frequency signal is higher than the threshold, if the strength of the amplified radio frequency signal is lower than the threshold, it is represented that the radio frequency signal needs to be amplified again. If the strength of the amplified radio frequency signal is higher than the threshold, it is represented that the radio frequency signal can be inputted directly to the mixer. In this operation, the receiving system can have better flexibility when receiving different signals. As a result, the gain of the receiving system can be adjusted to prevent the gain of the signal into non-linear area when it is amplified.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and used in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A signal receiving circuit, comprising:
   a first amplifier is electrically coupled to a node and configured to amplify a radio frequency signal to generate a first amplified radio frequency signal;
   a switch circuit is electrically coupled to the node and configured to receive the first amplified radio frequency signal;
   a second amplifier is electrically coupled to the switch circuit and configured to receive and amplify the first amplified radio frequency signal to generate a second amplified radio frequency signal; and
   a mixer is electrically coupled to the second amplifier and configured to modulate one of the first amplified radio frequency signal and the second amplified radio frequency signal to generate a mixed signal,
   wherein the switch circuit is configured to determine whether the first amplified radio frequency signal is amplified by the second amplifier;
   wherein the switch circuit comprises:
      a power detector is electrically connected to the node and configured to detect a voltage of the node;
      a first switch, comprising a first node, a second node, and a first control node, wherein the first node is electrically coupled to a first input node of the second amplifier; the second node is electrically coupled to a first output node of the second amplifier, and the first control node is electrically coupled to the power detector; and
      a second switch, comprising a third node, a fourth node, and a second control node, wherein the third node is electrically coupled to a second input node of the second amplifier; the fourth node is electrically coupled to a second output node of the second amplifier, and the second control node is electrically coupled to the power detector.

2. The signal receiving circuit of claim 1, wherein the power detector is configured to determine whether the voltage of the node is higher than a threshold, if the voltage of the node is higher than the threshold, the power detector is configured to output a control signal to switch the first switch and the second switch to an enable mode, and the power detector is configured to output the first amplified radio frequency signal to the mixer; if the voltage of the node is lower than the threshold, the power detector is configured to output the control signal to switch the first switch and the second switch to a disable mode, and the second amplifier is configured to amplify the first amplified radio frequency signal and output the second amplified radio frequency signal to the mixer.

3. The signal receiving circuit of claim 2, wherein the threshold is set as −10 dbm.

4. The signal receiving circuit of claim 1, further comprising:
   a transformer is electrically coupled to the node and the second amplifier, and configured to transmit the first amplified radio frequency signal to the second amplifier as an input signal of the second amplifier.

5. A wireless communication system, comprising:
   an antenna is disposed outside a chip and electrically coupled to a pad; and
   a signal receiving circuit is disposed inside the chip and electrically coupled to the pad, and the signal receiving circuit comprises:
      a first amplifier is electrically coupled to a node and configured to amplify a radio frequency signal to generate a first amplified radio frequency signal;
      a switch circuit is electrically coupled to the node and configured to receive the first amplified radio frequency signal;
      a second amplifier is electrically coupled to the switch circuit and configured to receive and amplify the first amplified radio frequency signal to generate a second amplified radio frequency signal; and
      a mixer is electrically coupled to the second amplifier and configured to modulate one of the first amplified radio frequency signal and the second amplified radio frequency signal to generate a mixed signal,
      wherein the switch circuit is configured to determine whether the first amplified radio frequency signal is amplified by the second amplifier;
      wherein the switch circuit comprises:
         a power detector is electrically connected to the node and configured to detect a voltage of the node;
         a first switch, comprising a first node, a second node, and a first control node, wherein the first node is electrically coupled to a first input node of the second amplifier; the second node is electrically coupled to a first output node of the second amplifier, and the first control node is electrically coupled to the power detector; and
         a second switch, comprising a third node, a fourth node, and a second control node, wherein the third node is electrically coupled to a second input node of the second amplifier; the fourth node is electrically coupled to a second output node of the second amplifier, and the second control node is electrically coupled to the power detector.

6. The wireless communication system of claim 5, wherein the power detector is configured to determine whether the voltage of the node is higher than a threshold, if the voltage of the node is higher than the threshold, the power detector is configured to output a control signal to switch the first switch and the second switch to an enable mode, and the power detector is configured to output the first amplified radio frequency signal to the mixer; if the voltage of the node is lower than the threshold, the power detector is configured to output the control signal to switch the first switch and the second switch to a disable mode, and the second amplifier is configured to amplify the first amplified radio frequency signal and output the second amplified radio frequency signal to the mixer.

7. The wireless communication system of claim 5, further comprising:
   a transformer is electrically coupled to the node and the second amplifier, and configured to transmit the first amplified radio frequency signal to the second amplifier as an input signal of the second amplifier.

8. The wireless communication system of claim 5, wherein the antenna operates in a first frequency band and a second frequency band, wherein the first frequency band is the 2.412~2.484 GHz frequency band, and the second frequency band is the 2.402~2.480 GHz frequency band.

* * * * *